United States Patent
Merritt et al.

(10) Patent No.: US 6,587,978 B1
(45) Date of Patent: Jul. 1, 2003

(54) CIRCUIT AND METHOD FOR VARYING A PULSE WIDTH OF AN INTERNAL CONTROL SIGNAL DURING A TEST MODE

(75) Inventors: Todd A. Merritt; George B. Raad; Stephen L. Casper, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1639 days.

(21) Appl. No.: 08/603,943

(22) Filed: Feb. 20, 1996

Related U.S. Application Data

(63) Continuation of application No. 08/195,639, filed on Feb. 14, 1994, now abandoned.

(51) Int. Cl.[7] ............................................. G11C 29/00
(52) U.S. Cl. ........................................ 714/718; 365/201
(58) Field of Search ............................. 371/21.1, 21.4, 371/21.5; 365/189.01, 200–201, 189.05, 193; 364/265.3; 395/183.01, 183.03, 183.06; 711/155, 156; 713/400; 714/718, 721, 722, 15, 25, 39, 46, 48, 724, 42, 44, 45; 707/202

(56) References Cited

U.S. PATENT DOCUMENTS

| | | | |
|---|---|---|---|
| 3,781,683 A | 12/1973 | Freed | 324/158 F |
| 3,803,483 A | 4/1974 | McMahon, Jr. | 324/158 F |
| 3,832,535 A | 8/1974 | De Vito | 714/743 |
| 3,849,872 A | 11/1974 | Hubacher | 324/158 T |
| 4,079,338 A | 3/1978 | Kronlage | 331/57 |
| 4,099,722 A | 7/1978 | Rodesch et al. | 273/143 R |
| 4,139,818 A | 2/1979 | Schneider | 324/512 |
| 4,434,328 A | 2/1984 | Fields | 361/155 |
| 4,575,825 A * | 3/1986 | Ozaki et al. | 365/189 |
| 4,594,711 A | 6/1986 | Thatte | 714/728 |
| 4,597,617 A | 7/1986 | Enochs | 439/66 |
| 4,635,261 A | 1/1987 | Anderson et al. | 714/732 |
| 4,677,586 A | 6/1987 | Magar et al. | 364/900 |
| 4,771,407 A * | 9/1988 | Takemae et al. | 371/21.1 |
| 4,783,719 A | 11/1988 | Jamison et al. | 324/537 |
| 4,890,270 A | 12/1989 | Griffith | 368/113 |
| 4,894,805 A | 1/1990 | Godslialk et al. | 365/222 |
| 4,899,107 A | 2/1990 | Corbett et al. | 324/765 |
| 4,907,117 A | 3/1990 | Pease et al. | 361/54 |
| 4,954,878 A | 9/1990 | Fox et al. | 439/66 |
| 4,956,602 A | 9/1990 | Pasrrish | 324/158 R |

(List continued on next page.)

FOREIGN PATENT DOCUMENTS

| | | | |
|---|---|---|---|
| EP | 0494782 | 9/1992 | |
| JP | 55205555 | 2/1980 | |
| JP | 0181548 | 10/1984 | 437/8 |
| JP | 61-274335 | 12/1986 | H01L/21/66 |
| JP | 61-274355 | 12/1986 | H01L/27/10 |
| JP | 0139039 * | 2/1989 | H01L/21/82 |
| JP | 1192099 * | 8/1989 | G11C/17/00 |
| JP | 0227081 | 9/1989 | 324/73.1 |
| JP | 4-2229499 | 8/1992 | G11C/29/00 |
| JP | 4264277 * | 9/1992 | G01R/31/28 |
| JP | 04-286800 | 10/1992 | G11C/29/00 |
| JP | 05-282858 | 10/1993 | G11C/11/401 |
| JP | 0612878 * | 1/1994 | G01R/31/318 |
| JP | 06-103760 | 4/1994 | G11C/11/406 |
| JP | 06-302198 | 10/1994 | G11C/29/00 |

OTHER PUBLICATIONS

"Microcomputer Hardware Design", Protopapas 1988 pp. 181–188.*

Primary Examiner—Albert Decady
Assistant Examiner—Guy Lamarre
(74) Attorney, Agent, or Firm—Schwegman, Lundberg, Woessner & Kluth, P.A.

(57) ABSTRACT

The invention is a dynamic random access memory (DRAM) device having an electronic test key fabricated on board and is a method for testing the DRAM. The electronic test key generates a signal which effects a variation in a pulse width of an internal control signal to stress the DRAM during a test mode.

19 Claims, 5 Drawing Sheets

U.S. PATENT DOCUMENTS

| | | | |
|---|---|---|---|
| 4,961,053 A | 10/1990 | Krug | 324/537 |
| 4,968,931 A | 11/1990 | Littlebury et al. | 324/760 |
| 4,987,365 A | 1/1991 | Shreeve et al. | 324/758 |
| 5,012,180 A | 4/1991 | Dalrymple et al. | 324/73.1 |
| 5,023,840 A * | 6/1991 | Tobita | 365/201 |
| 5,047,711 A | 9/1991 | Smith et al. | 324/158 R |
| 5,059,899 A | 10/1991 | Farnworth et al. | 324/13.1 |
| 5,065,091 A * | 11/1991 | Tobita | 324/158 R |
| 5,073,874 A | 12/1991 | Yamada et al. | 365/226 |
| 5,083,299 A | 1/1992 | Schwanke et al. | 368/113 |
| 5,099,196 A | 3/1992 | Longwell et al. | 324/158 R |
| 5,109,320 A | 4/1992 | Bourdelaise et al. | 361/785 |
| 5,111,433 A | 5/1992 | Miyamoto | 365/201 |
| 5,142,224 A | 8/1992 | Smith et al. | 324/158 R |
| 5,153,509 A | 10/1992 | Dalrymple et al. | 371/15.1 |
| 5,155,704 A | 10/1992 | Walther et al. | 365/201 |
| 5,204,837 A * | 4/1993 | Suwa et al. | 365/201 |
| 5,208,777 A | 5/1993 | Shibata | 365/201 |
| 5,210,856 A * | 5/1993 | Auvinen et al. | 713/400 |
| 5,251,174 A | 10/1993 | Huang | 365/200 |
| 5,257,233 A | 10/1993 | Schaefer | 365/227 |
| 5,274,591 A | 12/1993 | Waller et al. | 365/189.5 |
| 5,276,647 A * | 1/1994 | Matsui et al. | 371/21.1 |
| 5,295,110 A | 3/1994 | Sakakibara | 365/222 |
| 5,307,010 A | 4/1994 | Chiu | 324/766 |
| 5,321,661 A | 6/1994 | Iwakiri et al. | 365/222 |
| 5,355,342 A | 10/1994 | Ueoka | 365/201 |
| 5,365,481 A | 11/1994 | Sawada | 365/201 |
| 5,384,741 A | 1/1995 | Haraguchi et al. | 365/201 |
| 5,400,289 A | 3/1995 | Blodgett | 355/222 |
| 5,428,575 A | 6/1995 | Fudeyasu | 365/201 |
| 5,457,400 A | 10/1995 | Ahmad et al. | 324/763 |
| 5,483,175 A | 1/1996 | Ahmad et al. | 324/766 |
| 5,619,463 A | 4/1997 | Malhi | 365/201 |
| 5,627,478 A | 5/1997 | Habersetzer et al. | 324/763 |
| 5,708,802 A | 1/1998 | Morishima et al. | 713/600 |
| 5,831,918 A | 11/1998 | Merritt et al. | 365/201 |
| 5,845,059 A | 12/1998 | McClure | 714/27 |
| 5,991,214 A | 11/1999 | Merritt et al. | 365/201 |
| 6,118,711 A | 9/2000 | Merritt | 365/200 |
| 6,160,413 A | 12/2000 | Habersetzer et al. | 324/763 |
| 6,255,838 B1 | 7/2001 | Habersetzer et al. | 324/763 |
| 2001/0015654 A1 | 8/2001 | Habersetzer et al. | 324/763 |

* cited by examiner

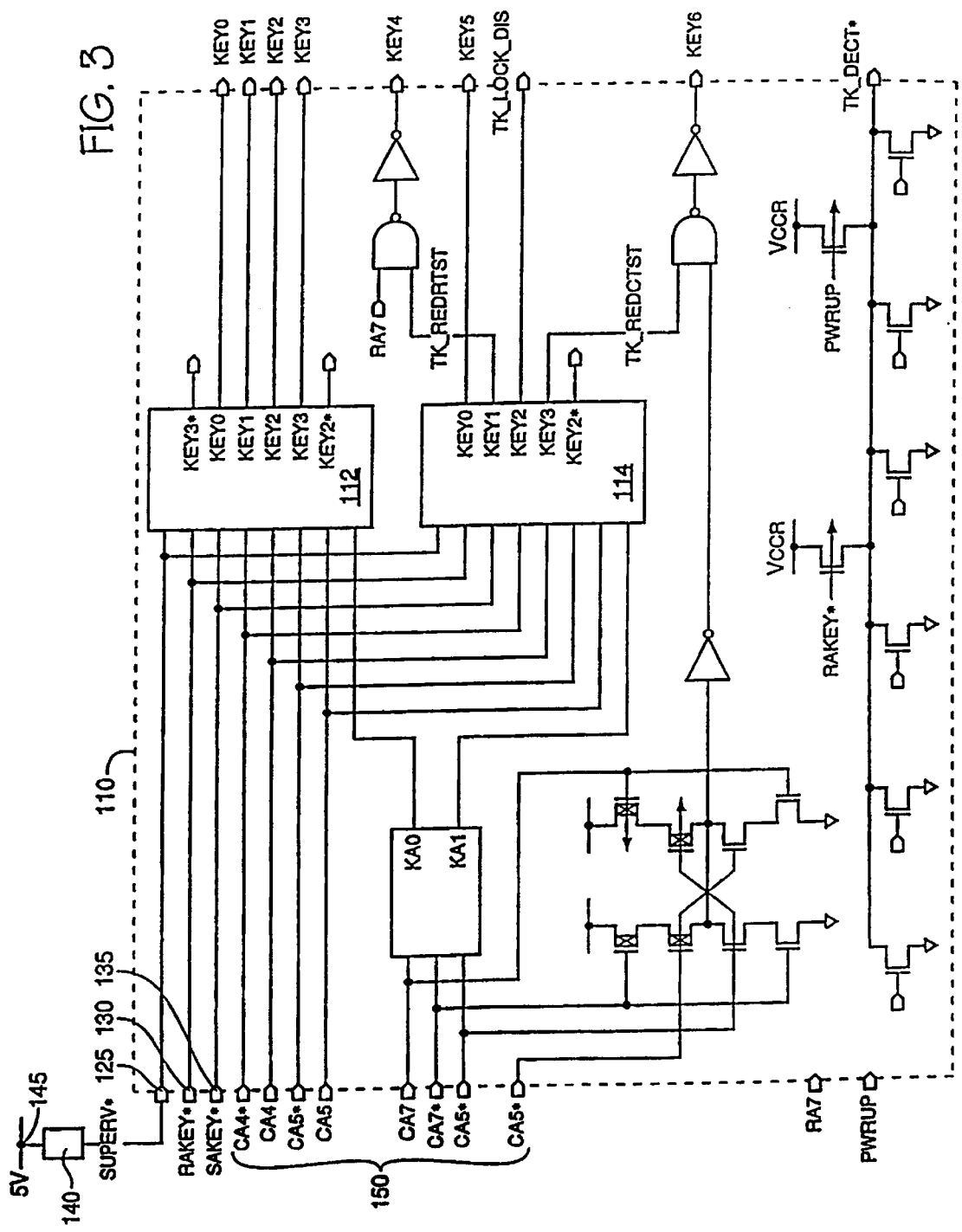

CIRCUIT AND METHOD FOR VARYING A PULSE WIDTH OF AN INTERNAL CONTROL SIGNAL DURING A TEST MODE

This application is a continuation of application Ser. No. 08/195,639 filed Feb. 14, 1994, now abandoned.

CROSS REFERENCE TO RELATED APPLICATIONS

This application is being filed simultaneously with and contains similar material to copending application having Ser. No. 08/196,619, entitled "A CIRCUIT AND METHOD FOR VARYING A PERIOD OF AN INTERNAL CONTROL SIGNAL DURING A TEST MODE."

This application may also contain similar material to copending U.S. patent application Ser. No. 08/121,813, entitled "A CIRCUIT AND METHOD FOR DISABLING A LOCKOUT FUNCTION," and to copending U.S. patent application Ser. No. 08/096,643, entitled "SEMICONDUCTOR ARRAY HAVING BUILT-IN TEST CIRCUITRY FOR WAFER LEVEL TESTING."

FIELD OF THE INVENTION

The invention relates to the testing of electrical devices, and more particularly to an internal test key and internal circuitry for testing an encapsulated DRAM.

BACKGROUND OF THE INVENTION

A dynamic random access memory (DRAM) consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. An arrangement of memory cells is called an array. There are two options available in a DRAM memory: a bit of data may be stored in a specific cell in the write mode, or a bit of data may be retrieved from a specific cell in the read mode. The data is transmitted on signal lines, also called digit lines, to and from the Input/Output lines, hereinafter known as I/O lines, through field effect transistors used as switching devices and called decode transistors. For each bit of data stored, its true logic state is available at the I/O lines and its complementary logic state is available at lines designated I/O*. Each cell has two digit lines referred to as digit line pairs.

In order to read from or write to a cell, the particular cell in question must be selected, also called addressed. Typically, the cells are arranged in the array in a configuration of intersecting rows and columns. In previous generations of DRAMs to select a cell an active output from a row decoder selects a wordline appropriate to the given address in response to an active external row address strobe (RAS) signal. In most applications the active RAS signal is low. The active wordline then turns on the cell's access transistor. Next the column decoder activates and selects the desired digit line pair in response to a column address strobe (CAS) signal. For a write operation the active column decoder output activates the decode transistors to pass the data to be written from the I/O lines to the digit line pair. The data is coupled through the access transistor to the memory cells which store the data.

More recent generations of DRAMS have lockout circuits on board that "catch" pulses that are too short and lock out the premature transitions of external signals to the DRAM. For example if the tRAS functional specification, the minimum time that RAS must be active for the DRAM to function normally, is violated the lockout circuit will ignore a transition of the external RAS signal to the inactive state until the DRAM has had time to sense and restore the memory properly. Thus the lockout circuit generates an internal RAS signal having a greater pulse width than the pulse width of the corresponding external RAS signal when the external RAS signal doesn't meet the tRAS functional specification. A similar circuit exists for tRP, the minimum time that RAS must be inactive during precharge. In both cases lockout circuits have made testing of the DRAM more difficult.

The tRAS functional specification as defined above and the tRAS specification typically defined in the DRAM data book should not be confused. In order to meet the data book tRAS specification the DRAM must function normally if the external RAS signal is active for a length of time equal to or greater than the data book tRAS specification.

Before the internal lockout circuits were incorporated into the DRAM circuit the pulse width of the external control signal could be decreased or increased, as the case may be, to stress the DRAM while testing the device. With the advent of internal lockout circuits this is no longer possible since the lockout circuit automatically decreases or increases the pulse width of the external control signal when it fails to meet the functional specification. Thus testing becomes more difficult, especially on encapsulated DRAMs. Instead of failing for a simple test, such as would be the case where the pulse width of an external control signal can be varied, the part fails more complicated tests later in the test flow process.

There exists a need to be able to test, with better guardband, DRAMs having lockout circuitry. The guardband is a region in which the part is capable of operating which lies outside of a region defined by the specifications of the part.

For DRAMS having self-refresh, the internal refresh rate is variable due to process variation, temperature effects, voltage levels, and in some cases elective trimming to attain a particular refresh rate or standby current level. Since the refresh is done internally, it can be estimated but not measured. This makes it impossible to detect whether the part is right on the edge of failing or not.

In order to ensure that you have guardband for the self-refresh mode, there exits a need to find a way to increase the period of the refresh cycle during a test mode. Parts which pass tests when the period of the refresh cycle is increased are not on the edge of failing.

SUMMARY OF THE INVENTION

The invention is a monolithic chip having a timing circuit, a memory circuit, and an electronic test key fabricated on board and is the method of testing the monolithic chip. The timing circuit generates a control signal in response to a timing signal. The electronic test key responds to a test signal and generates a mode signal to control a value of a pulse width of said control signal during normal operation and during a test mode. The memory circuit responds to the control signal during normal operations and during a test mode.

Typically, the electronic test key responds to at least one external test signal to control a circuit test on the part. The electronic test key generates a signal which varies a pulse width of a pulse of an internal control signal in order to stress the part and test with good guardband and margin. The invention is particularly useful in DRAM technologies.

In one embodiment, the invention is an electronic circuit having a lockout circuit and an electronic test key. The lockout circuit generates an internal control signal. During normal operation the lockout circuit responds to an external control signal to generate an internal control signal having a desired pulse width independent of a pulse width of the external control signal. During testing, the electronic test key on the DRAM generates a mode signal which varies the pulse width of the active pulse of the internal control signal to stress the electronic circuit. Circuit tests are then performed to see if the circuit functions correctly when stressed.

The invention ensures that parts which pass the test mode have good guardband and provides good production feedback. For example, lots of DRAMs that have a high row line resistance will be susceptible to a shorter tRP pulse width. The test mode of the invention weeds out parts that are on the verge of failing due to the lock-outs being too "tight". It will also give feedback as to where lockout delays should be adjusted and if there are defective delay elements in the lockout circuits.

BRIEF DESCRIPTION OF THE DRAWINGS

FIG. 3 is a more detailed schematic of a test key circuit shown in FIG. 1A or 2A.

DETAILED DESCRIPTION OF THE INVENTION

Figure 1A:
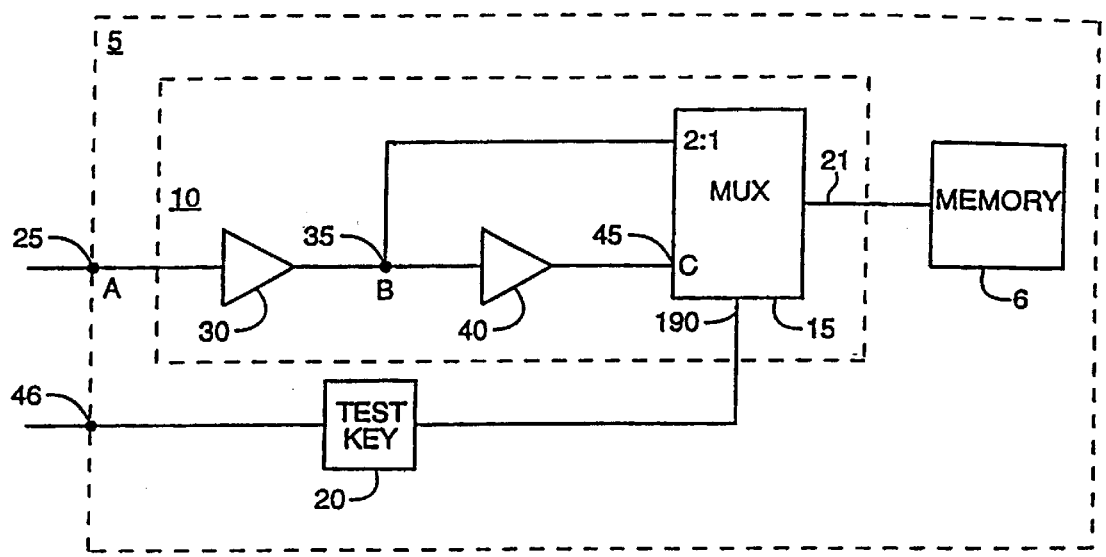
FIG. 1A is a schematic of a lockout circuit and test key of a first embodiment of the invention.
Figure 2A:
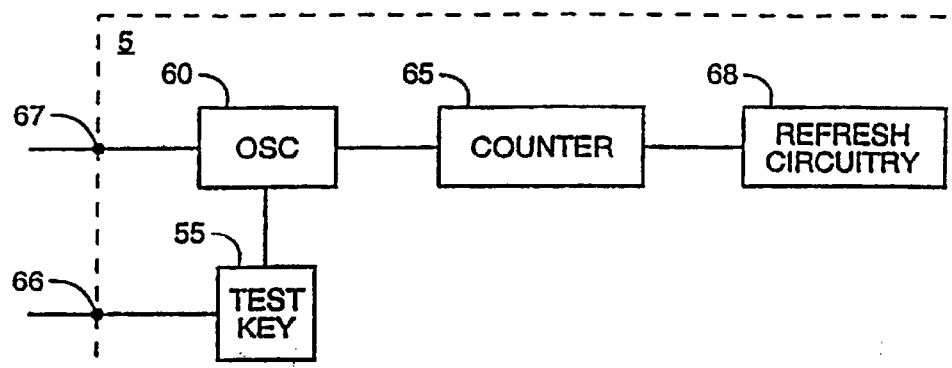
FIG. 2A is a block schematic of an oscillator, counter, and test key of a second embodiment of the invention.

FIGS. 1A and 2A are block schematics depicting the elements of two embodiments of the invention. The invention is an monolithic dynamic random access memory (DRAM) device 5. The DRAM 5 is fabricated on a supporting substrate and is typically encapsulated. The DRAM 5 stores data in memory cells (not shown) arranged in a matrix of intersecting rows and columns in a memory circuit 6. External signals on external address input pins (not shown) address the DRAM and determine which memory cell is selected for a read or write operation. One combination of external address signals specifies the row on which a selected memory cell is located and one combination of address signals specifies the column on which the selected cell is located. The memory device is responsive to an external row address strobe (RAS) signal for strobing in the row location and is responsive to a column address strobe (CAS) signal for strobing in a column location.

The DRAM 5 of FIG. 1A comprises a lockout circuit 10 having a multiplexer 15 and comprises an electronic test key 20. The lockout circuit 10 generates an internal RAS control signal at multiplexer output 21 in response to the external RAS control signal at input node 25. The internal RAS control signal controls at least one circuit function of memory circuit 6. A positive going transition of the external RAS signal at input node 25(A) experiences a delay in first delay circuit 30 such that an active pulse at node 35(B) has a greater pulse width than the pulse width of the corresponding active pulse of the external RAS signal at node 25. The positive going transition of the signal at node 35 experiences a delay in a second delay circuit 40 such that the active pulse at node 45(C) has a greater pulse width than the pulse width of the active pulse at node 35.

The test key circuit 20 responds to a combination of external test signals on at least one input node 46 to generate a mode signal to control the output signal of multiplexer 15. During normal operation of the DRAM the signal at node 45 is selected by the mode signal of test key circuit 20 and multiplexed to the output node 21 of multiplexer circuit 15. During a test mode the signal at node 35 is multiplexed to output node 20 in response to the mode signal of test key circuit 20. The signal at node 21 is the internal RAS control signal.

Figure 1B:
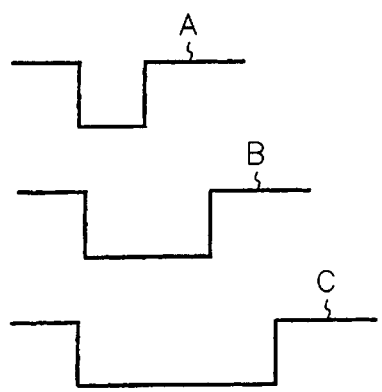
FIG. 1B compares relative pulse widths of signals at nodes A, B, and C of FIG. 1.

FIG. 1B compares the relative pulse widths of the active pulses at nodes 25, 35, and 45. It can be seen that the pulse width of the active pulse at node 45(C), which is multiplexed to output node 21 during normal operation, is greater than the pulse width of the active pulse at node 35 (B) which, is multiplexed to output node 21 during the test mode. Circuit tests are conducted when the pulse width of the active pulse of the internal RAS control signal, B, is less than would normally be expected, C, for the part. This stresses the part during test and ensures that the part has good guardband.

The DRAM 5 of FIG. 2A comprises a test key circuit 55, an oscillator circuit 60, and a counter 65. The test key circuit 55 responds to at least one external signal at node 66 to generate a mode signal to control the oscillator during normal operation and during a test mode. The oscillator circuit 60 responds to a self-refresh signal by oscillating. The self-refresh signal may be generated internally in response to at least one external signal at node 67. During normal operation the oscillator is designed to generate an alternating signal having a frequency within a desired range. The counter is designed to pulse after a desired number of oscillations thereby generating a square wave having a lower frequency than the oscillator frequency. The counter output signal activates refresh circuitry 68 and determines the refresh period which is equal to the cycle time or period of the counter output signal times the number of rows being refreshed. The refresh circuitry restores memory cell voltages to their originally stored levels.

During the test mode the test key 55 generates an active signal which decreases the frequency of the oscillator signal thereby increasing the refresh period.

Figure 2B:
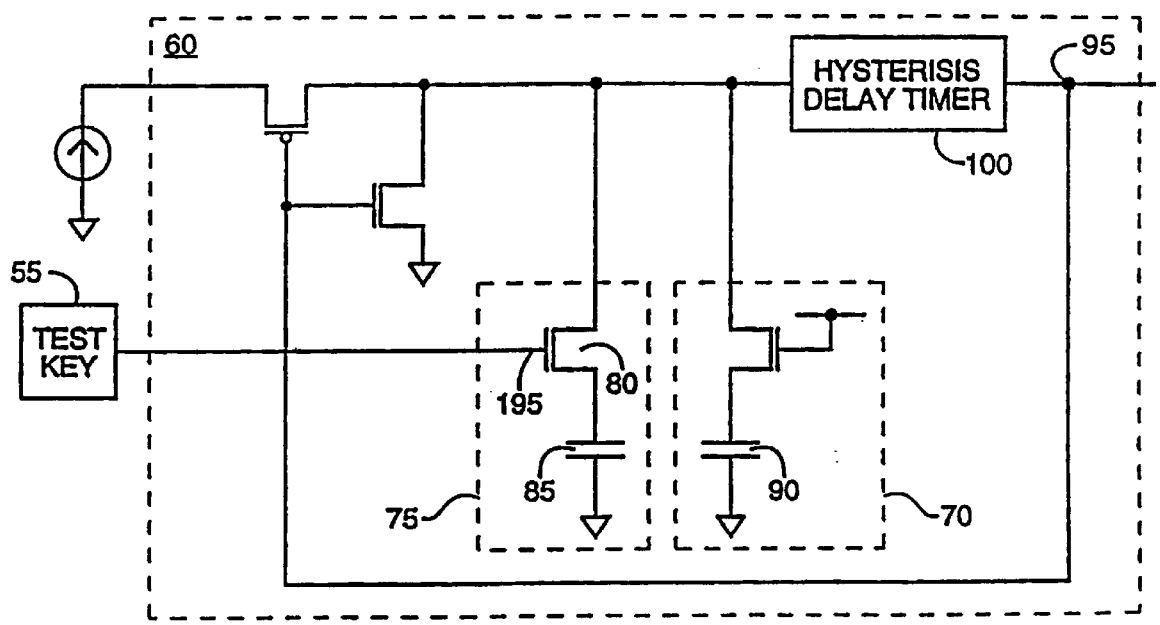
FIG. 2B is a more detailed schematic of the oscillator of FIG. 2A.

FIG. 2B is a simplified schematic of a portion of the oscillator circuit 60 of the invention. The oscillator comprises a primary oscillator circuit 70 and a secondary oscillator circuit 75. During normal operation only the primary oscillator circuit generates an alternating signal. During normal operation the test key circuit 55 generates an output signal which deactivates switch 80 and isolates capacitor 85 from the primary oscillator circuit 70. During the test mode the mode signal of test key circuit 55 activates switching device 80 thereby coupling capacitor 85 in parallel with capacitor 90. The total capacitance increases during the test mode and is the total capacitance of capacitors 85 and 90. Since discharge is slower for a greater capacitance, the frequency of the oscillator output signal at the output node 95 of the hysteresis delay timer circuit 100 is less during the test mode than during normal operation. Since the frequency is less the period of the oscillator output signal and the period of counter output signal is greater. Thus the self-refresh period is greater. The percentage increase in the self-refresh period is equal to the percentage increase in the total capacitance of the oscillator circuit during the test mode and is therefore easily controlled.

Figure 2C:
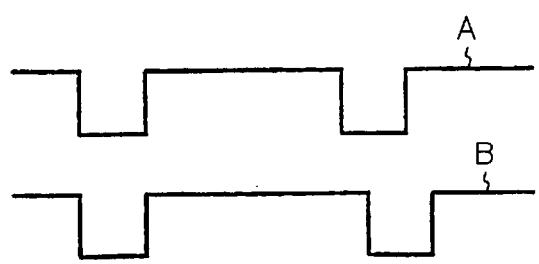
FIG. 2C compares the period of a refresh signal during normal operation and during a test mode.

FIG. 2C compares the period of the refresh signal during normal operation, represented by square wave A, and the period of the refresh signal during the test mode, represented by square wave B. The frequency of the oscillator decreases during the test mode increasing the period of the refresh signal. Increasing the period of the refresh signal increases the pulse width of at least one of the pulses of the refresh signal, in this example the more positive pulse.

FIG. 3 is an electronic test key circuit 20 or 55 of FIGS. 1A and 2A respectively. In FIG. 3 the electronic test key will be referred to as primary test key 110. The primary test key 110 comprises test key subcircuits. Each subcircuit generates signals to control various test functions. There are two blocks 112 and 114, each of which comprises a plurality of subcircuits. It can be seen that the primary test key 110 is responsive to potentials at various input nodes. In particular the primary test key 110 is responsive to a super voltage logic signal at input node 125, a reset test key (RAKEY*) signal at input node 130, and a set test key (SAKEY*) signal at input node 135. The SAKEY* signal is generated in response to a write enable (WE) before CAS before RAS (WCBR) cycle, which means that WE and CAS are low when RAS goes low. The super voltage logic signal is generated in a super voltage logic circuit 140 in response to the potential of a super voltage at node 145. Signals on Address inputs 150 function as codes to determine which test key subcircuits are activated during the testing process. During the test mode the address input signals typically are varied as the DRAM is tested.

The super voltage is a voltage typically 4 volts greater than a supply potential applied to the DRAM during normal operation. For example, a DRAM having a 5 volt supply potential typically has a 9 volt super voltage. Logic signals are generated in response to the super voltage to control the testing of the DRAM. By utilizing a potential significantly larger than the supply potential as the super voltage the DRAM does not accidently go into a test mode during normal operation.

Figure 4:
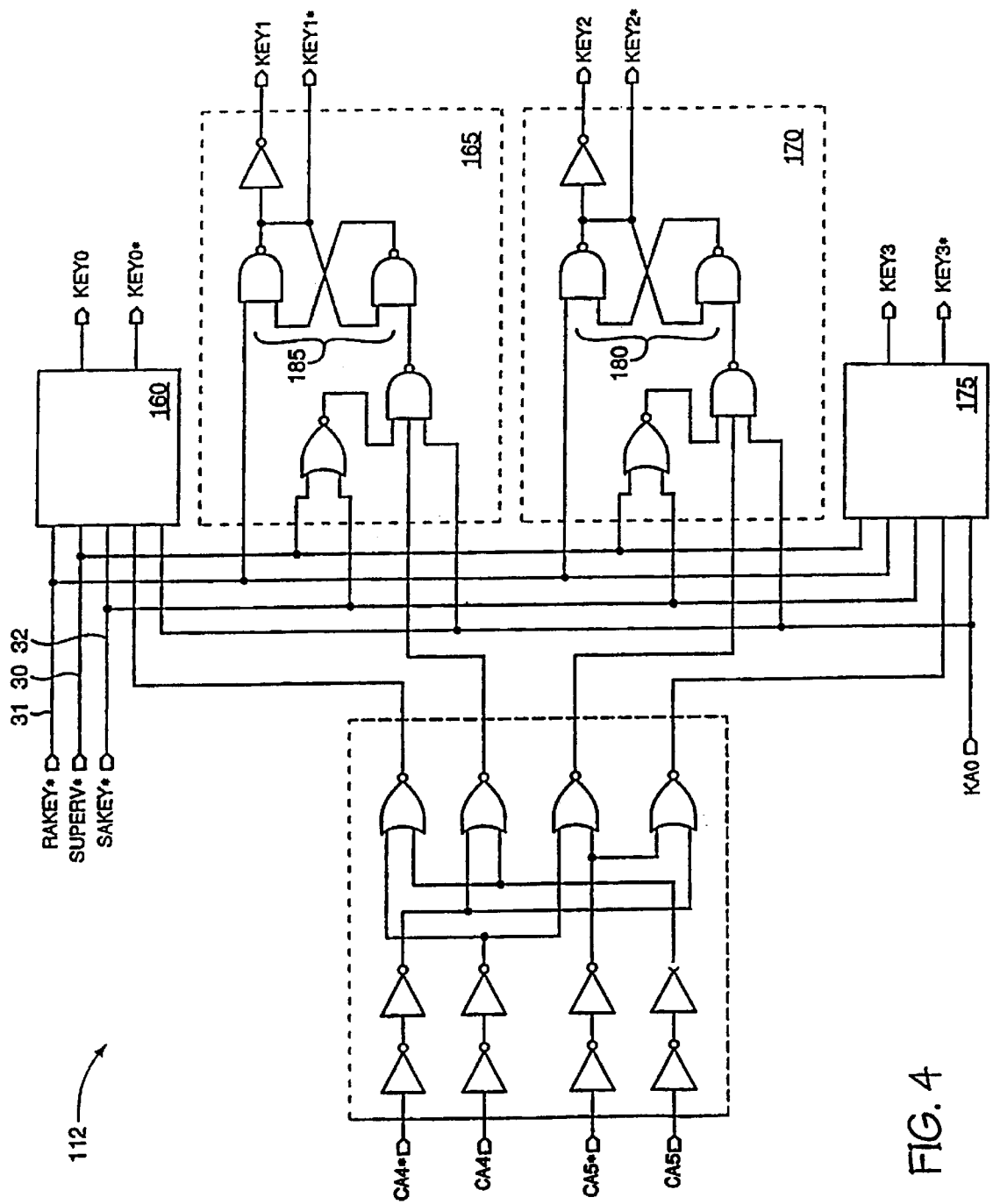
FIG. 4 is a more detailed schematic of a portion of the test key circuit of FIG. 3.

FIG. 4 is the schematic representation of block 112 of FIG. 3 and is selected in response to potentials on CA7, CA7*, and CA5*. Block 112 is responsive to address input signals on address input pins CA4, CA4*, CA5, and CA5*, test key enable signals RAKEY* and SAKEY*, and the super voltage logic signal. In block 112 there are four test key subcircuits 160, 165, 170 and 175. In the first embodiment the test key subcircuit 170 generates a signal to control the multiplexer of FIG. 1A and in the second embodiment the test key subcircuit 165 generates a signal to control the configuration of the oscillator circuit 60 of FIG. 2A.

The test key subcircuit 170 is enabled when RAKEY* is high, when SAKEY* and the super voltage logic signal (SUPERV*) are low, when CA4 and CA5* are low, and when KA0 is high. When the test key subcircuit 170 is enabled latch circuitry 180 latches an active test signal at the control node 190 of the multiplexer circuit 15 of FIG. 1A, thereby selecting the signal at node 35 as the internal RAS control signal. The subcircuit 170 is disabled during normal operation, and an inactive test signal is latched to the control node 190 of the multiplexer circuit 15 of FIG. 1A thereby selecting the signal at node 45 as the internal RAS control signal.

Thus the invention ensures that parts which pass the test mode have good guardband with respect to the lockout circuit pulse widths and provides good production feedback. For example, "lots" of DRAMs that have a high row line resistance will be susceptible to a shorter tRP pulse width. The test mode of the invention weeds out parts that are on the verge of failing due to the lock-outs being too "tight". It will also give feedback as to where the lockout delays should be adjusted and if there are defective delay elements in the lockout circuits.

The test key subcircuit 165 is enabled when RAKEY* is high, when SAKEY* and SUPERV* are low, when CA4* and CA5 are low, and when KA0 is high. When the test key subcircuit 165 is enabled latch circuitry 185 latches an active test signal at the control input 195 of transistor 80 in FIG. 2B thereby increasing the total capacitance of the oscillator circuit. The increased capacitance causes the oscillator frequency to decrease which, in turn, causes the self-refresh period to increase in the test mode, thereby stressing the part in the test mode. When the test key subcircuit 165 is disabled during normal operation an inactive test signal is latched at control input 195 isolating capacitor 85 from capacitor 90 and decreasing the total capacitance of the oscillator circuit from the total capacitance present during the test mode.

Since the self-refresh period is greater during the test mode there is more time for the storage capacitor of the DRAM to discharge, and the DRAM is stressed. DRAMs passing tests performed while being stressed as described above have good guardband. If the part passes the test mode it automatically has added margin. The percentage of added margin can be closely controlled and no longer relies on taking into account all variables, such as temperature, transistor characteristics, and defects. Test programs in the back end can be simplified because they don't have to cover a range of values or bin out parts to different self-refresh values. In fact the part must only be tested for current draw and functionality in self-refresh.

Figure 5:
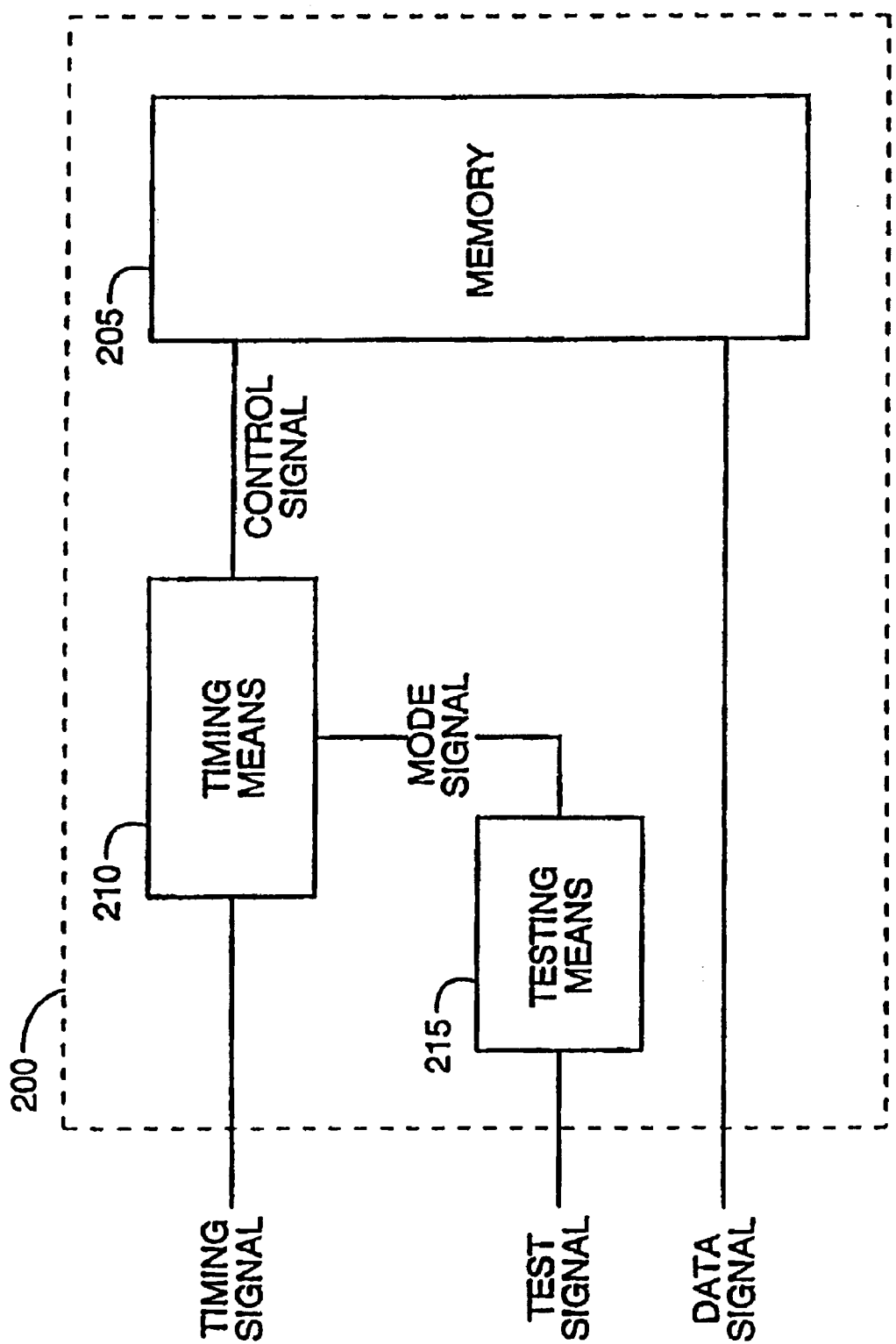
FIG. 5 is a block schematic comprising portions of the monolithic chip of the invention.

FIG. 5 is block schematic of a monolithic chip 200 of the invention. The chip 200 receives at least 3 signals, a timing signal, a test signal, and a data signal. A memory 205 stores data in response to the data signal. A timing means 210 generates a control signal in response to the timing signal. A testing means 215 generates a mode signal in response to the test signal. The mode signal has a first value during normal operation and a second value during a test mode. The mode signal controls the pulse width of a pulse of the control signal in a first embodiment of the invention and controls a period of the control signal in a second embodiment of the invention. By internally varying the pulse width or period of the control signal in response to the mode signal, the memory can be stressed during test.

It has been shown that the invention provides efficient testing of encapsulated DRAMS by controlling the pulse width and periods of internal control signals. The invention not only saves valuable manufacturing time but also reduces costs and provides reliable testing of the manufactured DRAM.

The invention uses various materials which are electrically either conductive, insulative, or semiconductive, although the completed semiconductor circuit device itself is usually referred to as a "semiconductor."

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

Although the invention has been described in terms of a test key circuit used to vary a pulse width of a pulse generated by a lock out circuit and to vary a period of a self-refresh signal, it is possible, within the scope of the invention, to have an electronic test key which varies pulse widths and/or periods of other control signals during a test mode. And although the invention has been described in terms of a DRAM, the circuit and method have utility in other circuits where testing of the circuit can be performed more efficiently by using internal circuitry to vary pulse widths, periods, and frequencies of internal control signals. Accordingly the invention should be read as limited only by the claims.

What is claimed is:

1. An electrical device having a circuit function during a normal operation mode, said electrical device fabricated on a supporting substrate, said electrical device comprising:
   a) a first internal circuit for generating a first internal RAS signal having a pulse width in response to an external RAS signal, said electrical device performing the circuit function in response to said first internal RAS signal; and
   b) a second internal circuit for generating an internal test signal in response to an external test signal, said second internal circuit in electrical communication with said first internal circuit, wherein a value of said pulse width of said first internal RAS signal varies during a test mode from a value of said pulse width during the normal operation mode in response to said internal test signal.

2. The electrical device as specified in claim 1, wherein said first internal circuit comprises:
   a) a first delay circuit having a first delay circuit output signal;
   b) a second delay circuit having a second delay circuit output signal; and
   c) a multiplexer circuit responding to said internal test signal to multiplex said first delay circuit output signal to an output node of said first internal circuit as said internal RAS signal during said test mode and responding to said internal test signal to multiplex said second delay circuit output signal to said output node of said first internal circuit as said internal RAS signal during said normal operation mode.

3. A monolithic memory device for storing electrical data, comprising:
   a) a means for generating an internal RAS signal having a pulse, said memory device performing a normal operation circuit function in response to said RAS signal in a normal operation mode; and
   b) a means for varying a value of a pulse width of said pulse during a testing of a performance of said normal operation circuit function from a value of said pulse width during said normal operation mode.

4. The memory device as specified in claim 3, wherein the memory device is a dynamic random access memory device.

5. A memory device for storing data, the memory device being responsive to an external RAS signal and an external test signal, comprising:

a) an internal lockout circuit for generating an internal RAS signal having a pulse in response to said external RAS signal, said pulse of said internal RAS signal meeting a minimum pulse width circuit requirement during normal operation of the memory device regardless of a pulse width of a corresponding pulse of said external RAS signal; and
   b) an internal test key circuit in electrical communication with said internal lockout circuit, said internal test key circuit responding to said external test signal to provide a test key signal, said internal lockout circuit responding to said test key signal during a test mode to decrease said pulse width of said pulse of said internal RAS signal in order to stress the memory device during a test mode.

6. The memory device as specified in claim 5, wherein said lockout circuit comprises:
   a) a first delay circuit for delaying a transition of the internal RAS signal in response to a transition of the external RAS signal, an output signal of said first delay circuit being said internal RAS signal during the test mode; and
   b) a second delay circuit for causing a further delay in said transition of the internal RAS signal, an output signal of said second delay circuit being said internal RAS signal during the normal operation of said memory device.

7. The memory device as specified in claim 6, wherein said internal lockout circuit comprises a multiplexer circuit responding to said test key signal to select said output signal of said first delay circuit during the test mode and responding to said test key signal to select said output signal of said second delay circuit during said normal operation, an output of said multiplexer circuit being said internal RAS signal.

8. The memory device as specified in claim 7, wherein said internal test key circuit comprises a latch circuit for latching said test key signal to a control input of said multiplexer circuit.

9. A monolithic memory device for storing data, comprising:
   a) a lockout means for locking out effects of an external RAS signal thereby increasing a value of a pulse width of a pulse of an internal RAS signal from a value of a pulse width of a corresponding pulse of said external RAS signal during a normal operation of the monolithic memory device; and
   b) an internal testing means for decreasing the value of the pulse width of the internal RAS signal during a test mode from the value of the pulse width of the pulse of the internal RAS signal during the normal operation.

10. A method of operating an encapsulated memory device, comprising the following steps:
    a) generating an internal RAS signal in the encapsulated memory device;
    b) performing a memory circuit function during a normal operation of the memory device in response to said internal RAS signal;
    c) generating a test signal in the encapsulated memory device;
    d) varying a pulse width of a pulse of said internal RAS signal in response to said test signal in order to stress the memory device; and
    e) testing said memory circuit function during said step of varying.

11. The method as specified in claim 10, further comprising the step of decreasing said pulse width during said step of varying.

12. The method as specified in claim 10, wherein the method further comprises the following steps:
   a) providing said internal RAS signal in response to an external RAS signal;
   b) delaying a transition of said internal RAS signal in response to a transition of the external RAS signal during said step of providing thereby increasing a value of said pulse width of said pulse of said internal RAS signal from a value of a pulse width of a corresponding pulse of said external RAS signal, said step of delaying performed during the normal operation of the memory device; and
   c) decreasing the value of said pulse width of said pulse of said internal RAS signal during said test mode from said value of said pulse width of said pulse of said internal RAS signal during the normal operation of the memory device.

13. The method as specified in claim 10, further comprising delaying a transition of an external RAS signal to generate a first delayed signal in the encapsulated memory device, wherein said first delayed signal is said internal RAS during said step of testing.

14. The method as specified in claim 13, further comprising delaying a transition of said first delayed signal to generate a second delayed signal in the encapsulated memory device, wherein said second delayed signal is said internal RAS signal during said step of performing.

15. The method as specified in claim 14, wherein said step of generating comprises multiplexing said first delayed signal and said second delayed signal to an internal node of said encapsulated memory device, said first and said second delayed signals functioning as said internal RAS signal.

16. The method as specified in claim 15, further comprising latching said test signal to a control input of said multiplexer circuit.

17. A method for operating an encapsulated electrical device, comprising the following steps:
   a) internally generating in the electrical device an internal RAS signal having a pulse having a pulse width during a normal operation mode; and
   b) varying a value of the pulse width of said pulse of said internal RAS signal during a test mode.

18. A method for operating an encapsulated electrical device, comprising the following steps:
   a) accepting an external RAS signal as an input of the electrical device;
   b) internally generating an internal RAS signal having a pulse in response to said external RAS signal, said pulse of said internal RAS signal meeting a minimum pulse width circuit requirement during a normal operation of the electrical device regardless of a pulse width of a corresponding pulse of said external RAS signal; and
   c) accepting an external test signal;
   d) providing an internal test key signal in response to said internal test signal; and
   e) decreasing said pulse width of said pulse of said internal RAS signal during a test mode.

19. A method for operating an encapsulated electrical device, comprising the following steps:
   a) locking out effects of an external RAS signal;
   b) increasing a value of a pulse width of a pulse of an internal RAS signal from a value of a pulse width of a corresponding pulse of said external RAS signal during a normal operation of the electrical device in response to said step of locking out; and
   c) decreasing the value of the pulse width of the internal RAS signal during a test mode from the value of the pulse width of the pulse of the internal RAS signal during the normal operation.

* * * * *

UNITED STATES PATENT AND TRADEMARK OFFICE
CERTIFICATE OF CORRECTION

PATENT NO.    : 6,587,978 B1
DATED         : July 1, 2003
INVENTOR(S)   : Merritt et al.

It is certified that error appears in the above-identified patent and that said Letters Patent is hereby corrected as shown below:

Title page,
Item [56], References Cited, U.S. PATENT DOCUMENTS, insert the following:
-- 4,365,481    12/1982    Pearlstein, F. et al.    62/123 --.
FOREIGN PATENT DOCUMENTS, delete "55205555    2/1980" and insert
-- 5520555   2/1980 --, therefor.

Signed and Sealed this

Seventh Day of September, 2004

JON W. DUDAS
*Director of the United States Patent and Trademark Office*